(12) United States Patent
Lee et al.

(10) Patent No.: US 8,481,352 B2
(45) Date of Patent: Jul. 9, 2013

(54) METHOD OF FABRICATING LIGHT EMITTING DIODE CHIP

(75) Inventors: Jun Hee Lee, Ansan-si (KR); Jong Kyu Kim, Ansan-si (KR); Yeo Jin Yoon, Ansan-si (KR)

(73) Assignee: Seoul Opto Device Co., Ltd., Ansan-si (KR)

(*) Notice: Subject to any disclaimer, the term of this patent is extended or adjusted under 35 U.S.C. 154(b) by 125 days.

(21) Appl. No.: 13/089,544

(22) Filed: Apr. 19, 2011

(65) Prior Publication Data

US 2011/0195538 A1 Aug. 11, 2011

Related U.S. Application Data

(63) Continuation of application No. 12/442,617, filed as application No. PCT/KR2007/004448 on Sep. 14, 2007, now Pat. No. 7,951,630.

(30) Foreign Application Priority Data

Sep. 30, 2006 (KR) .................. 10-2006-0096760

(51) Int. Cl.
*H01L 21/304* (2006.01)
*H01L 27/15* (2006.01)
*H01L 33/00* (2010.01)

(52) U.S. Cl.
USPC .............. 438/33; 438/34; 438/39; 438/40; 438/460; 257/E21.214; 257/E27.12; 257/E33.046

(58) Field of Classification Search
USPC .............. 438/33, 46, 458, 460, 34, 39, 40; 257/E21.214, E27.12, E33.046
See application file for complete search history.

(56) References Cited

U.S. PATENT DOCUMENTS 6,083,769 A 7/2000 Kurahashi
6,818,531 B1 * 11/2004 Yoo et al. .................. 438/458

(Continued)

FOREIGN PATENT DOCUMENTS

JP 06-318731 11/1994
JP 10-341035 12/1998

(Continued)

OTHER PUBLICATIONS

International Search Report of PCT/KR2007/004448 issued on Dec. 27, 2007.

(Continued)

*Primary Examiner* — Zandra Smith
*Assistant Examiner* — Toniae Thomas
(74) *Attorney, Agent, or Firm* — H.C. Park & Associates, PLC

(57) ABSTRACT

The present invention provides a method of fabricating a light emitting diode chip having an active layer between an N type semiconductor layer and a P type semiconductor layer. The method comprises the steps of preparing a substrate; laminating the semiconductor layers on the substrate, the semiconductor layers having the active layer between the N type semiconductor layer and the P type semiconductor layer; and forming grooves on the semiconductor layers laminated on the substrate until the substrate is exposed, whereby inclined sidewalls are formed by the grooves in the semiconductor layers divided into a plurality of chips. According to embodiments of the present invention, a sidewall of a semiconductor layer formed on a substrate of a light emitting diode chip is inclined with respect to the substrate, whereby its directional angle is widened as compared with a light emitting diode chip without such inclination. As the directional angle of the light emitting diode chip is wider, when a white light emitting device is fabricated using the light emitting diode chip and a phosphor, light uniformity can be adjusted even though the phosphor is not concentrated at the center of the device. Thus, the overall light emitting efficiency can be enhanced by reducing a light blocking phenomenon caused by the increased amount of the phosphor distributed at the center portion.

8 Claims, 4 Drawing Sheets

U.S. PATENT DOCUMENTS

| | | | |
|---|---|---|---|
| 6,818,532 B2 * | 11/2004 | Yeom et al. | 438/460 |
| 7,294,521 B2 * | 11/2007 | Yoo | 438/46 |
| 8,110,423 B2 * | 2/2012 | Okabe | 438/33 |
| 2001/0000209 A1 | 4/2001 | Krames et al. | |
| 2006/0124945 A1 | 6/2006 | Baur et al. | |
| 2008/0261341 A1 | 10/2008 | Zimmerman et al. | |
| 2010/0233835 A1 | 9/2010 | Kusunoki | |

FOREIGN PATENT DOCUMENTS

| | | |
|---|---|---|
| JP | 2005-159035 | 6/2005 |
| JP | 2005-302804 | 10/2005 |
| KR | 10-2005-0070459 | 7/2005 |
| KR | 10-2005-0104151 | 11/2005 |
| KR | 1020060032202 | 4/2006 |
| KR | 10-2006-0077801 | 7/2006 |
| WO | 2005/008792 A1 | 1/2005 |

OTHER PUBLICATIONS

Non-Final Office of U.S. Appl. No. 12/442,617 issued on Oct. 1, 2010.

Notice of Allowance of U.S. Appl. No. 12/442,617 issued on Jan. 19, 2011.

* cited by examiner

METHOD OF FABRICATING LIGHT EMITTING DIODE CHIP

CROSS REFERENCE TO RELATED APPLICATIONS

This application is a continuation of U.S. patent application Ser. No. 12/442,617, filed on Mar. 24, 2009, which is the National Stage of International Application No. PCT/KR2007/004448, filed on Sep. 14, 2007, and claims priority from and the benefit of Korean Patent Application No. 10-2006-0096760, filed on Sep. 30, 2006, which is hereby incorporated by reference for all purposes as if fully set forth herein.

BACKGROUND OF THE INVENTION

1. Field of the Invention

The present invention relates to a method of fabricating a light emitting diode chip, and more particularly, to a method of fabricating a light emitting diode chip which is improved in light emitting efficiency through an inclined sidewall of a semiconductor layer formed on a substrate.

2. Discussion of the Background

A light emitting diode (LED), which is a light converting device which has a junction structure of P and N type semiconductors, emits light through recombination of electrons and holes which are moved through the joined region of the P and N type semiconductors when forward voltage is applied. Since the color of the emitted light is determined by an energy gap, the LED of desired color can be fabricated according to a selection of a semiconductor material.

The LED capable of emitting various colors is widely applied to display elements and backlights for a variety of electronic appliances, dash boards, display boards and the like.

Also, the LED has less electric power consumption and longer lifespan as compared with an illuminator, such as a conventional light bulb or fluorescent lamp, so that the applications of the LED are expanded to general illumination while substituting for conventional illuminators. However, light emitting efficiency of the LED is very important in order for the LED to be used for general illumination, and a variety of technologies therefor have been under development.

Generally, the LED is fabricated in such a manner that semiconductor layers are successively formed on a substrate and light emitting regions are formed by etching the semiconductor layers. Then, individual LED chips are fabricated from the fabricated LED through a process of separating the substrate using a diamond tip. Then, the fabricated LED chip is used for manufacturing a white light emitting device for emitting white light through a variety of technologies.

For example, a phosphor is combined to adjust a white balance when a blue LED is used for fabricating a white light emitting device. Hitherto, in order to increase the white light emitting efficiency, most of the study has been devoted to increase of light power of an LED chip, research of EPI, a chip pattern and the like, and improvement of phosphor efficiency.

However, there is a problem in that the white light emitting efficiency has not been improved even though a LED chip with the identical phosphor and increased light power is used.

This is closely related to a characteristic of a directional angle of light emitted from the white LED. Generally, in the LED device such as a white LED, its light is bright at the center portion and becomes weaker as it goes to a side, as viewed from its front. Accordingly, the amount of the phosphor is increased at the center portion in order to adjust a white color ratio when fabricating the white light emitting device. However, a light block phenomenon as much as the increased amount of the phosphor occurs, which causes the white light efficiency of the white LED to be decreased as a result.

SUMMARY OF THE INVENTION

An object of the present invention is to provide a method of fabricating a white light emitting diode chip, in which a directional angle is widened by improving a structure of a light emitting diode chip and thus the light emitting efficiency is improved when the white light emitting diode using a phosphor is fabricated.

According to an aspect of the present invention for achieving the objects, there is provided a method of fabricating a light emitting diode chip having an active layer between an N type semiconductor layer and a P type semiconductor layer. The method comprises the steps of preparing a substrate; laminating the semiconductor layers on the substrate, the semiconductor layers having the active layer between the N type semiconductor layer and the P type semiconductor layer; and forming grooves on the semiconductor layers laminated on the substrate until the substrate is exposed, whereby inclined sidewalls are formed in the semiconductor layers divided into a plurality of chips.

The inclined sidewalls may be formed in the semiconductor layers divided into the plurality of chips by forming the grooves on the semiconductor layers using a blade having an inclined edge The blade edge is preferably inclined to have an edge angle in a range between 50 and 150.

The method may further comprise the steps of performing a scribing process on the substrate to be divided into the plurality of chips after forming the inclined sidewalls; and breaking the scribed substrate to separate the individual light emitting diode chips from each other.

According to embodiments of the present invention, a sidewall of a semiconductor layer formed on a substrate of a light emitting diode chip is inclined with respect to the substrate, whereby its directional angle is widened as compared with a light emitting diode chip without such inclination.

As the directional angle of the light emitting diode chip is wider, when a white light emitting device is fabricated using the light emitting diode chip and a phosphor, light uniformity can be adjusted even though the phosphor is not concentrated at the center of the device. Thus, the overall light emitting efficiency can be enhanced by reducing a light blocking phenomenon caused by the increased amount of the phosphor distributed at the center portion.

DETAILED DESCRIPTION OF THE ILLUSTRATED EMBODIMENTS

Figure 1:
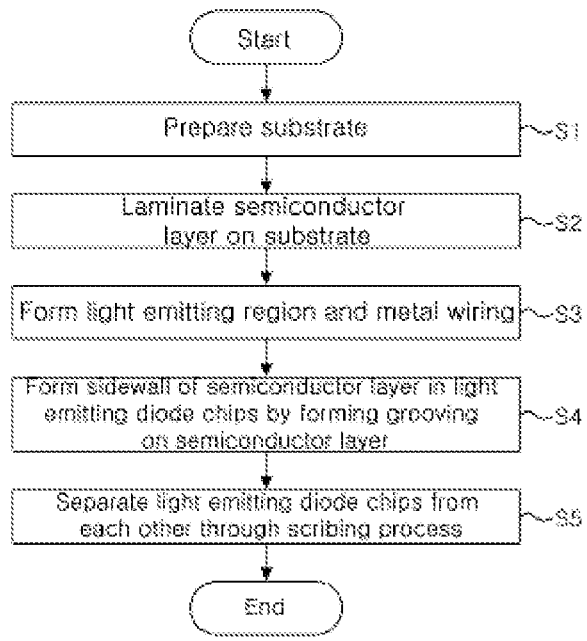
FIG. 1 is a flow chart illustrating a fabrication method of a light emitting diode chip according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
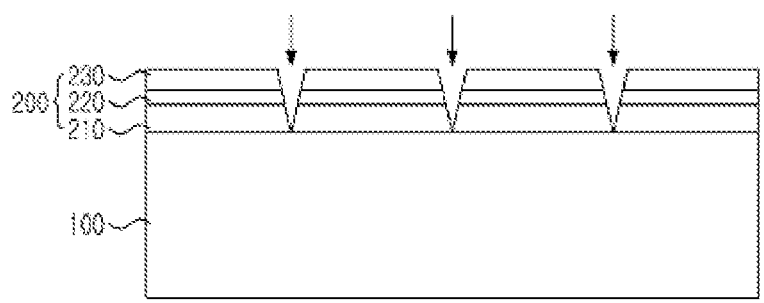
FIG. 2 and FIG. 3 are views illustrating the fabrication method of the light emitting diode chip according to the embodiment of the present invention.
Figure 3:
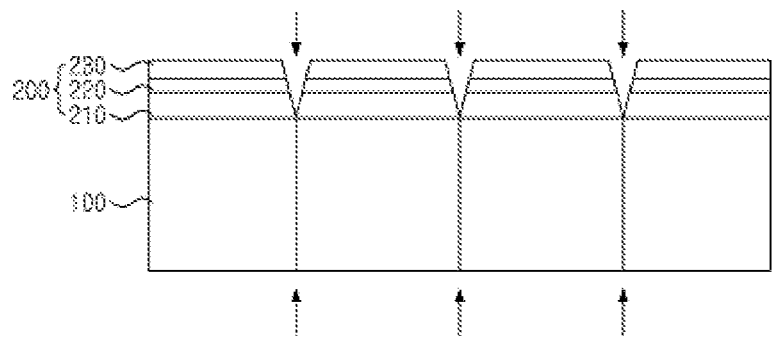

FIG. 1 is a flow chart illustrating a fabrication method of a light emitting diode chip according to an embodiment of the present invention, and FIG. 2 and FIG. 3 are views illustrating the fabrication method of the light emitting diode chip according to the embodiment of the present invention.

Referring to FIGS. 1 and 2, a substrate 100 is prepared (S1). The substrate 100 may be, for example, a sapphire ($Al_2O_3$) substrate, but is not limited to this and may be selected variously depending on semiconductor material layers to be formed on the substrate 100.

Then, semiconductor layers are formed on the substrate 100 (S2). The semiconductor layer has a lower semiconductor layer 210, an active layer 220 and an upper semiconductor layer 230 formed sequentially. The lower semiconductor layer 210, the active layer 220 and the upper semiconductor layer 230 may be respectively formed of a gallium nitride based semiconductor material, i.e., (B, Al, In, Ga)N. A composition element and a composition ratio are determined such that the active layer 220 emits light with a desired wavelength, e.g., ultraviolet light or blue light. Each of the lower and upper conductive semiconductor layers 210 and 230 is formed of a material with a band gap larger than that of the active layer 220.

The lower semiconductor layer 210, the active layer 220 and the upper semiconductor layer 230 may be intermittently or continuously grown using a technology such as metal organic chemical vapor deposition (MOCVD), molecular beam epitaxy, or hydride vapor phase epitaxy (HVPE).

Here, the lower and upper conductive semiconductor layers 210 and 230 are n-type and p-type, or p-type and n-type, respectively. In a GaN based compound semiconductor layer, an n-type semiconductor layer may be formed by being doped with Si as an impurity, and a p-type semiconductor layer may be formed by being doped with Mg as an impurity.

As shown in the figures, the lower conductive semiconductor layer 210 and/or the upper conductive semiconductor layer 230 may be formed in a single or multiple layer structure. Further, the active layer 220 may have a single or multiple quantum well structure.

Also, a buffer layer (not shown) may be interposed between the semiconductor layers 200 and the substrate 100 before the lower semiconductor layer 210 is formed. The buffer layer is formed to reduce lattice mismatch between the substrate 100 and the lower semiconductor layer 210 formed thereon, and may be formed, for example, of GaN or AN.

Next, photoresist patterns defining light emitting regions are formed on the upper semiconductor layer 230. The upper semiconductor layer 230, the active layer 220 and the lower semiconductor layer 210 are sequentially etched using the formed photoresist patterns as an etching mask to form the light emitting regions (S3).

Each of the light emitting regions so formed includes the lower semiconductor layer 210 on the substrate 100, the upper semiconductor layer 230 disposed on one region of the lower semiconductor layer 210, and the active layer 220 interposed between the lower semiconductor layer 210 and the upper semiconductor layer 230. The other regions of the lower semiconductor layer 210 are exposed. Thereafter, metallic wires are formed on the upper semiconductor layer 230 and the exposed lower semiconductor layer 210.

Meanwhile, before the metallic wires are formed, a metallic layer may be formed on the upper semiconductor layer 230 and an ohmic contact layer may be further formed on the exposed lower semiconductor 210. Although an ohmic contact layer may be formed on the upper semiconductor layer 230, details thereon will be omitted.

Then, grooves are formed by cutting a portion from the upper semiconductor layer 230 to the lower semiconductor layer 210 using a blade so that the substrate 100 is exposed (S4). The semiconductor layers 200 are divided into individual light emitting diode chips by the grooves formed in the semiconductor layers, and sidewalls of the semiconductor layers divided into the light emitting diode chips are formed to be inclined.

The blade used in forming the inclined semiconductor sidewalls of the light emitting diode chips of the present invention has an inclined edge, so that the sidewalls are formed to be inclined by an angle of the blade edge.

Referring to FIGS. 1 and 3, after the sidewalls of the semiconductor layers 200 formed on the substrate 100 are formed to be inclined by forming the grooves on the semiconductor layers 200 using the blade, a scribing process is performed on a bottom or top surface of the substrate 100 using a diamond tip or laser. Then, a plurality of the individual light emitting diode chips are separated from each other by breaking the substrate 100 by applying mechanical force thereto (S5).

Figure 4:
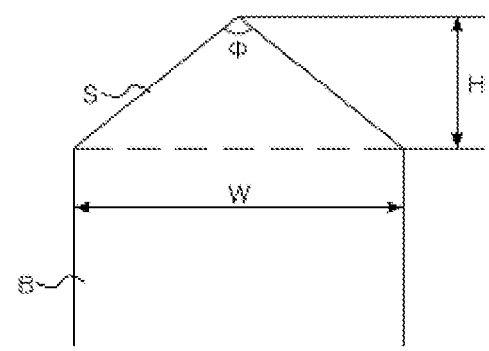
FIG. 4 is a cross section of a blade used in the fabricating method of the light emitting diode according to the present invention.

FIG. 4 is a cross section of a blade used in the fabricating method of the light emitting diode according to the present invention.

Referring to FIG. 4, in a blade B used for forming the sidewalls of the light emitting diode chips to be inclined, both opposite surfaces of a blade edge S formed at an end of the blade are inclined. The blade edge is preferably formed to have an edge angle f of about 50° to 150°

In the preferred embodiment of the present invention, since an inclined angle q of the light emitting diode sidewall is determined by the edge angle f of the blade edge S, the inclined angle q may be in a range between 25° and 75°.

That is, if the blade B is moved to form the groove on the semiconductor layers 200 formed on the substrate 100, the semiconductor layers are cut and the inclined groove is formed by the inclination of the blade edge S. Width W and height H of the blade edge S can be adjusted considering thickness of the semiconductor layer 200.

Figure 5:
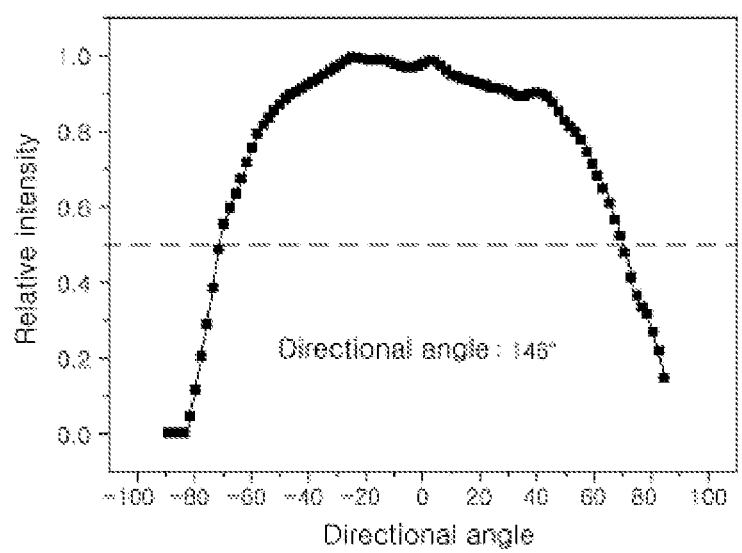
FIG. 5 is a graph of a measured directional angle in the light emitting diode chip according to the embodiment of the present invention.

FIG. 5 is a graph of a measured directional angle in the light emitting diode chip according to the embodiment of the present invention.

Referring to FIG. 5, the directional angle of the light emitting diode chip according to the embodiment of the present invention is 146°

Figure 6:
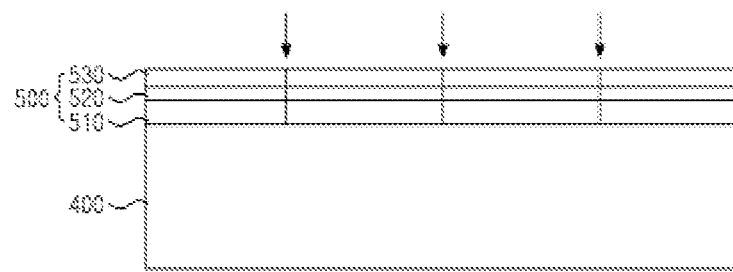
FIG. 6 is a view illustrating a fabrication method of a light emitting diode chip according to a comparative example.

In the meantime, FIG. 6 is a view illustrating a fabrication method of a light emitting diode chip according to a comparative example.

Referring to FIG. 6, in the fabrication method of the light emitting diode chip according to a comparative example, after a lower semiconductor layer 510, an active layer 520 and the upper semiconductor layer 530 are laminated on a substrate 400, the upper semiconductor layer 530, the active layer 520 and the lower semiconductor layer 510 are partially etched and electrode wiring is formed, thereby defining respective light emitting regions.

Then, after a scribing process is performed on a bottom or top surface of the substrate 400 using a diamond tip or laser, a plurality of the individual light emitting diode chips are separated from each other by breaking the substrate 400 by applying mechanical force thereto, without performing the groove forming process performed in the embodiment of the present invention, in which a groove is formed on the semiconductor layers by cutting a portion from the upper semiconductor layer to the lower semiconductor layer using a blade so that the substrate is exposed.

Figure 7:
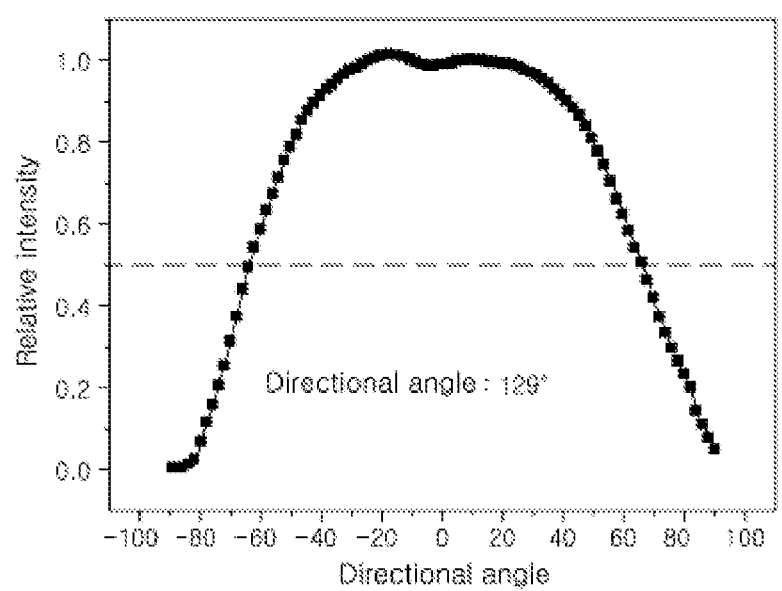
FIG. 7 is a graph of a measured directional angle in the light emitting diode chip according to the comparative example.

FIG. 7 is a graph of a measured directional angle in the light emitting diode chip according to the comparative example.

Referring to FIG. 7, the directional angle of the light emitting diode chip according to the comparative example is 129°.

As shown in the graphs of FIGS. 5 and 7, the inclined sidewall of the semiconductor layers forming a light emitting diode chip, which is formed by forming a groove on the semiconductor layers using a blade when the light emitting diode chip is formed according to the embodiment of the present invention, causes the directional angle to be widened, as compared with the comparative example in which a sidewall of semiconductor layers is not inclined.

The present invention has been described with reference to the preferred embodiment and various specific modifications. However, it will be understood by those skilled in the art that other embodiment different from the specific descriptions are also included in the spirit and scope of the present invention.

What is claimed is:

1. A method of fabricating a light-emitting diode chip, the method comprising:
    forming a first-type semiconductor layer, an active layer, and a second-type semiconductor layer on a first surface of a substrate, the active layer being disposed between the first-type semiconductor layer and the second-type semiconductor layer;
    forming a plurality of photoresist patterns on the second-type semiconductor layer, the photoresist patterns to define a plurality of light emitting regions;
    etching the first-type semiconductor layer, the active layer, and the second-type semiconductor layer using the photoresist patterns as an etching mask, thereby exposing a first portion of the first-type semiconductor layer;
    forming a plurality of metallic wires on the second-type semiconductor layer and the exposed first portion of the first-type semiconductor layer; and
    forming a plurality of grooves in the first-type semiconductor layer, the active layer, and the second-type semiconductor layer, the grooves exposing the substrate,
    wherein the grooves include inclined sidewalls that extend at a non-perpendicular angle with respect to the first surface of the substrate, through the first-type semiconductor layer, the active layer, and the second-type semiconductor layer.

2. The method of claim 1, wherein forming the plurality of grooves divides the first-type semiconductor layer, the active layer, and the second-type semiconductor layer into a plurality of light-emitting diode chips.

3. The method of claim 1, wherein forming the grooves comprises cutting the first-type semiconductor layer, the active layer, and the second-type semiconductor layer using a blade comprising an inclined edge.

4. The method of claim 3, wherein the blade edge is inclined at an angle between 50° and 150°.

5. The method of claim 3, wherein the inclined sidewalls are inclined at an angle between 25° and 75° with respect to the first surface of the substrate.

6. The method of claim 1, further comprising:
    performing a scribing process on the substrate after forming the inclined sidewalls; and
    breaking the scribed substrate to separate the light-emitting diode chips.

7. The method of claim 6, wherein the scribing process is performed on a bottom surface or a top surface of the substrate using a diamond tip or a laser.

8. The method of claim 1, wherein the directional angle of each light-emitting diode chip is 146°.

* * * * *